US006487692B1

(12) United States Patent
Morelos-Zaragoza

(10) Patent No.: US 6,487,692 B1
(45) Date of Patent: Nov. 26, 2002

(54) REED-SOLOMON DECODER

(75) Inventor: Robert Morelos-Zaragoza, Tokyo (JP)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/468,577

(22) Filed: Dec. 21, 1999

(51) Int. Cl.[7] .............................................. H03M 13/15
(52) U.S. Cl. ...................................................... 714/784
(58) Field of Search ......................................... 714/784

(56) References Cited

U.S. PATENT DOCUMENTS

| | | | | |
|---|---|---|---|---|
| 5,379,305 A | * | 1/1995 | Weng | 714/761 |
| 5,615,221 A | * | 3/1997 | Karp et al. | 714/752 |
| 5,841,378 A | * | 11/1998 | Klayman et al. | 341/350 |
| 6,081,920 A | * | 6/2000 | Morelos-Zaragoza | 714/784 |

OTHER PUBLICATIONS

Fenn et al., "Decoding Double–Error–Correcting Reed–Solomon Codes", IEE Proc.–Commun, vol. 142, No. 6, Dec. 1995, pp. 345–348.*
Wolf, "A DSP Reed–Solomon Coder", IEEE 1999, Custom Integrated Circuits Conference, pp. 541–544.*

* cited by examiner

Primary Examiner—Stephen M. Baker
(74) Attorney, Agent, or Firm—Suiter & Associates PC

(57) ABSTRACT

A Reed-Solomon decoder capable of correcting two symbol errors in a codeword of a Reed-Solomon RS(128,122,7) code over a Galois field GF(128) is provided. In an exemplary embodiment, the Reed-Solomon decoder is suitable for use in cable modems with little or no loss in error performance over Reed-Solomon decoder correcting three errors in a codeword.

21 Claims, 4 Drawing Sheets

US 6,487,692 B1

REED-SOLOMON DECODER

FIELD OF THE INVENTION

The present invention generally relates to the field of decoders utilized in digital communication systems for providing Forward Error Correction (FEC) and more particularly to a Reed-Solomon decoder capable of correcting two symbol errors in a codeword of a Reed-Solomon RS(128,122,7) code over a Galois field GF(128).

BACKGROUND OF THE INVENTION

Forward Error Correction (FEC) is a communications technique commonly used to correct errors occurring in data during transmission. Such errors may occur during transmission or storage for a number of reasons, for example, noise or interference in the transmission, or the like. Using FEC, data is processed through an algorithm that adds extra bits for error correction prior to transmission. If, when received, the transmitted data includes errors, the correction bits are used to repair the data.

Reed-Solomon codes, which are a subset of Bose-Chadhuri-Hocquenghm (BCH) linear block codes, are commonly used to provide forward error correction (FEC) in a variety of storage and communications systems, including tape, compact disc (CD), digital video disc (DVD), barcodes, cellular telephones, microwave links, satellite communications, digital television, high speed modems, and the like. In a typical Reed-Solomon system, an encoder takes a block of digital data and adds extra "redundant" bits. The Reed-Solomon decoder processes each block and attempts to correct errors occurring during transmission to recover the original data. The number and type of errors that can be corrected depends on the characteristics of the Reed-Solomon code.

To meet present cable modem standards, existing Reed-Solomon decoders utilized in cable modems, for instance, Berlekamp-Massey and Euclidean algorithm based decoders, attempt to correct three errors in a received codeword of an extended RS (128,122,7) code. However, correction of two errors, if possible, would be sufficient to meet present cable modem standards. Consequently, existing RS(128,122,7) decoders are unnecessarily complex. Consequently, it is desirable to provide a Reed-Solomon decoder capable of correcting two symbol errors in a codeword of an extended Reed-Solomon RS(128,122,7) code over a Galois field GF(128).

SUMMARY OF THE INVENTION

Accordingly, the present invention is directed to a decoder for a digital communication system providing Forward Error Correction (FEC), wherein the decoder employs a novel method of correcting up to two symbol errors in a codeword of a linear block code. In one embodiment, the present invention is directed to a Reed-Solomon decoder capable of correcting up to two symbol errors in a codeword of a Reed-Solomon code, in particular, a Reed-Solomon RS(128, 122,7) code over a Galois field GF(128). In an exemplary embodiment, the Reed-Solomon decoder is suitable for use in cable modems with little or no loss in error performance over Reed-Solomon decoders correcting three errors in a codeword.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiment of the invention, an example of which is illustrated in the accompanying drawings.

Figure 1:
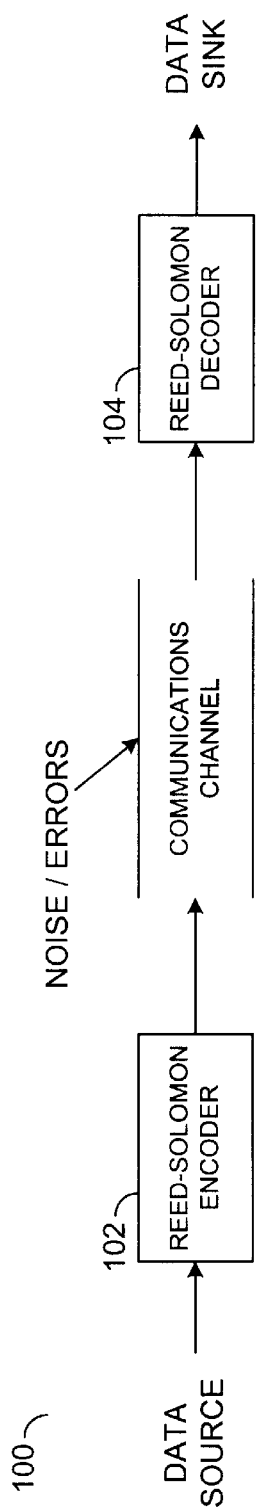
FIG. 1 is a block diagram of an exemplary communication system utilizing Reed-Solomon encoding.

Referring now to FIG. 1, a typical communication system utilizing a linear block encoding scheme, specifically, a Reed-Solomon encoding scheme is discussed. The communication system 100 includes a Reed-Solomon encoder 102 and a Reed-Solomon decoder 104. The Reed-Solomon encoder 102 takes a block of digital data ("DATA SOURCE") and adds extra "redundant" bits prior to transmission. The Reed-Solomon decoder 104 processes each block of the data and attempts to correct errors occurring during transmission to recover the data as originally encoded ("DATA SINK").

Figure 2:
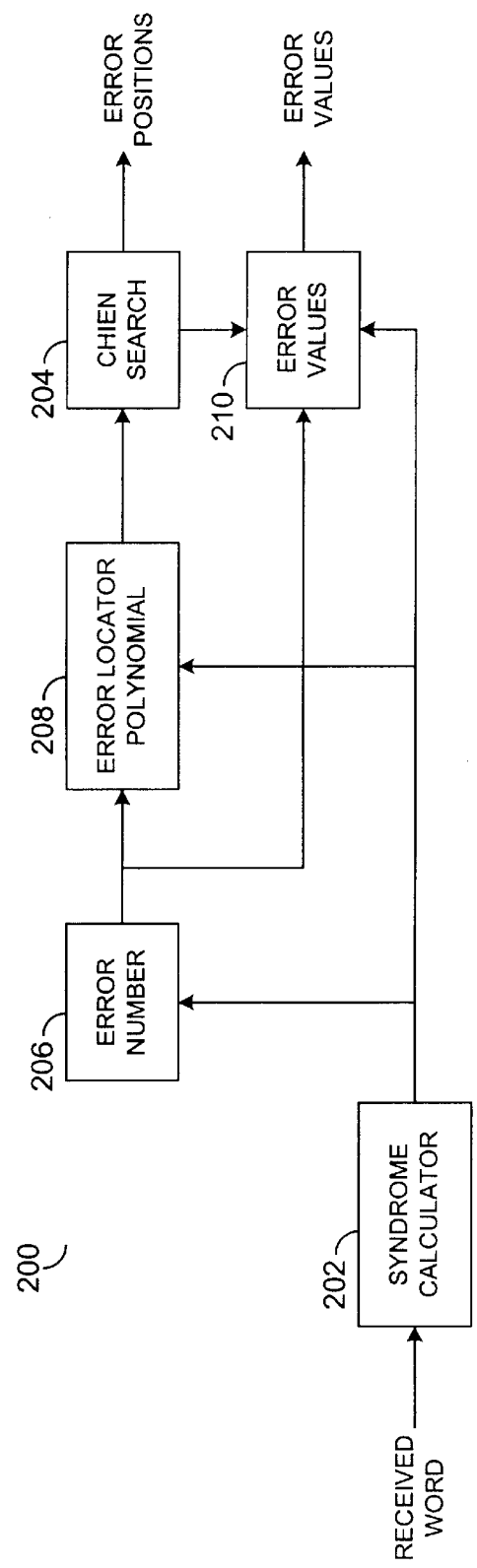
FIG. 2 is a block diagram of a double error correcting Reed-Solomon decoder in accordance with an exemplary embodiment of the present invention.

Referring now to FIG. 2, an exemplary Reed-Solomon decoder in accordance with the present invention is described. The Reed-Solomon decoder 200 is capable of correcting two symbol errors in a codeword of an extended Reed-Solomon code and, in particular an RS(128,122,7) code over a Galois field GF(128). In exemplary embodiments of the invention, the Reed-Solomon decoder 200 may be implemented as one or more hardware devices or by a machine readable program of instructions capable of causing a machine such as a general purpose computer to implement instructions for causing the machine to simulate the behavior of the Reed-Solomon decoder 200.

In an exemplary embodiment, the Reed-Solomon decoder 200 is comprised of a syndrome calculator 202, a Chien search module 204, and associated logic and/or hardware, shown in FIG. 2 as blocks 206, 208 & 210, capable of solving two systems of linear equations over GF(128). The decoder 200 allows correction up to two symbol errors within the first 127 (cyclic) positions of a received codeword 212. For an extended RS(128,122,7) code, the coefficients of the error locator polynomial, σ(x), whose roots determine the locations of the errors, are related to the syndromes of the received word by a 2 by 2 matrix equation.

Thus, as shown in FIG. 2, the syndrome calculator 202 first calculates syndromes of the received Reed-Solomon codeword 212. A Reed-Solomon codeword has 2t syndromes where t represents the maximum error correction capability. Thus, for the Reed-Solomon decoder 200 of the present invention, wherein the decoder is capable of correcting up to two symbol errors within an extended RS(128, 122,7) codeword, four syndromes (labeled herein "$S_1$", "$S_2$", "$S_3$" and "$S_4$") are calculated. In an exemplary embodiment, calculation of the syndromes may be accomplished in the same manner as n Berlekamp-Massey and Euclidean algorithm base decoders.

For a Reed-Solomon RS(128,122,7) codeword, the error locator polynomial has the form $$\sigma(x) = \sum_{i=0}^{e} \sigma_i x^i$$

where e represents the number of symbol errors (e.g., e=0, 1 or 2 errors). The number of errors (e), where e=0, 1 or 2 is determined at block 206 ("ERROR NUMBER") by testing the rank of the 2 by 2 matrix equation $$\begin{bmatrix} S_1 & S_2 \\ S_2 & S_3 \end{bmatrix} \begin{bmatrix} \sigma_2 \\ \sigma_1 \end{bmatrix} = \begin{bmatrix} S_3 \\ S_4 \end{bmatrix}.$$

wherein $S_1$, $S_2$, $S_3$ and $S_4$ are the syndromes calculated by the syndrome calculator 202. If all of the syndromes calculated by the syndrome calculator 202 are zero, then the number of errors equals zero (e=0) and decoding stops. Otherwise, the decoder 200 attempts to solve a system of e=2 equations. The determinant of the system is calculated and if nonzero, the number of errors equals two (e=2). Alternately, if the calculated determinant of the system is zero, then a determinant corresponding to one error (e=1) is computed and if nonzero, the number of errors equals one (e=1). If all determinants are zero, errors are detected.

The coefficients of the error locator polynomial σ(x) are calculated at block 208 ("ERROR LOCATOR POLYNOMIAL"). In an exemplary embodiment, the coefficients of the error locator polynomial are computed by solving the set of linear equations (for example, by inverting a Hankel matrix):

$$\begin{bmatrix} S_1 & S_2 \\ S_2 & S_3 \end{bmatrix} \begin{bmatrix} \sigma_2 \\ \sigma_1 \end{bmatrix} = \begin{bmatrix} S_3 \\ S_4 \end{bmatrix}.$$

In order to avoid divisions or inverse computations, the solutions of the linear equations are scaled by the determinant.

In an exemplary embodiment, the positions of the errors ("ERROR POSITIONS"), if errors are found to exist at block 206, are determined by the Chien search module 204 via a Chien search.

The values of the errors found at block 206 are calculated at block 208 ("ERROR VALUES"). In one embodiment, an e by e matrix equation generally having the form $$\begin{bmatrix} X_1 & X_2 \\ X_1^2 & X_2^2 \end{bmatrix} \begin{bmatrix} Y_1 \\ Y_2 \end{bmatrix} = \begin{bmatrix} S_1 \\ S_2 \end{bmatrix}$$

is solved to find the error values (for example by inverting a Vandermonde matrix).

Figure 3:
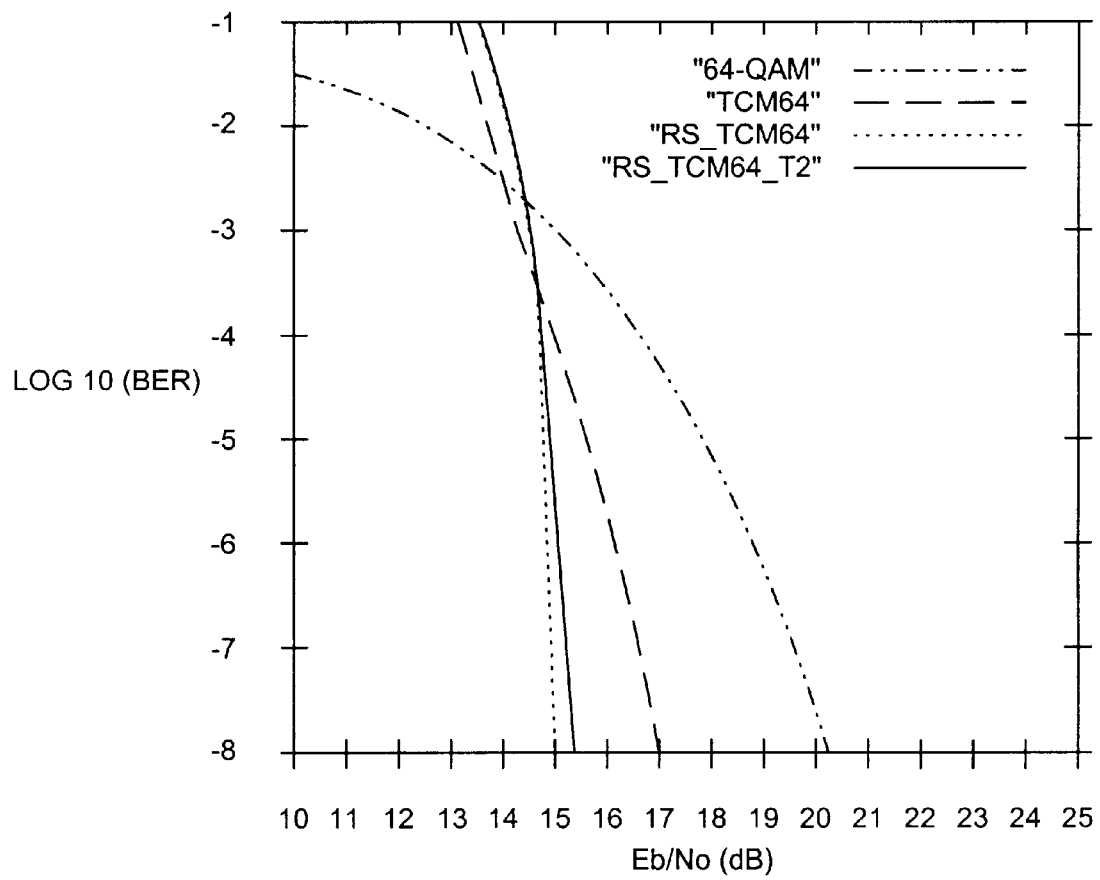
FIG. 3 is a graph illustrating the bit error ratio (BER) of 64 Quadrature Amplitude Modulation (64-QAM) with Trellis-Coded Modulation/Veterbi Decoding (TCM) of Reed-Solomon decoders with three-error correction and two-error correction.
Figure 4:
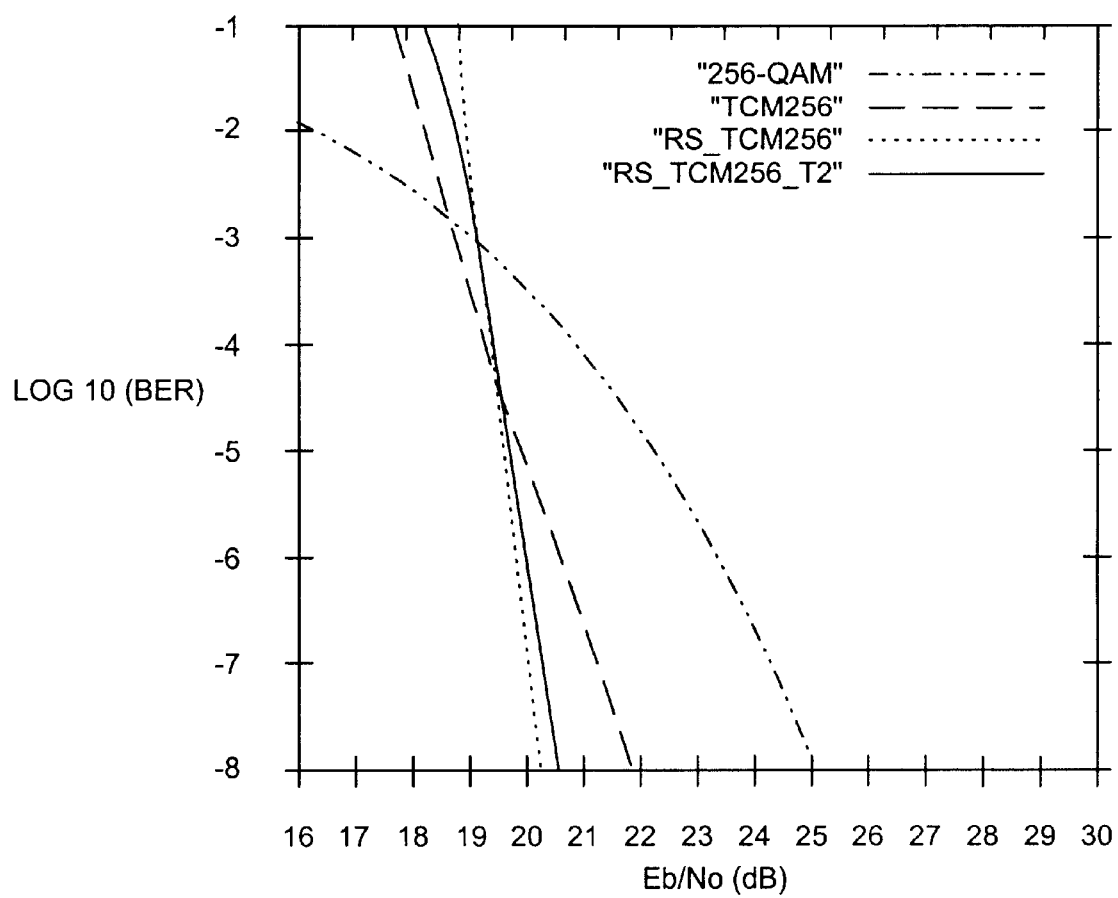
FIG. 4 is a graph illustrating the bit error ratio (BER) of 256 Quadrature Amplitude Modulation (256-QAM) with Trellis-Coded Modulation/Veterbi Decoding (TCM) of Reed-Solomon decoders with three-error correction and two-error correction.

Referring now to FIGS. 3 and 4, expressions of the bit error rate (BER) versus the energy per bit to noise power ratio (Eb/No) are shown for RS(128,122,7) decoders correcting two and three symbol errors. In particular, FIG. 3 is a graph illustrating the bit error ratio (BER) of 64 Quadrature Amplitude Modulation (64-QAM) with Trellis-Coded Modulation/Veterbi Decoding (TCM) of Reed-Solomon decoders with three-error correction and two-error correction while FIG. 4 is a graph illustrating the bit error ratio (BER) of 256 Quadrature Amplitude Modulation (256-QAM) with Trellis-Coded Modulation/Veterbi Decoding (TCM) of Reed-Solomon decoders with three-error correction and two-error correction. It will be apparent to one of ordinary skill in the art, upon examination of FIGS. 3 and 4, that the loss in performance between decoders correcting two and three errors is small enough to meet existing requirements for use in cable modems.

Figure 5:
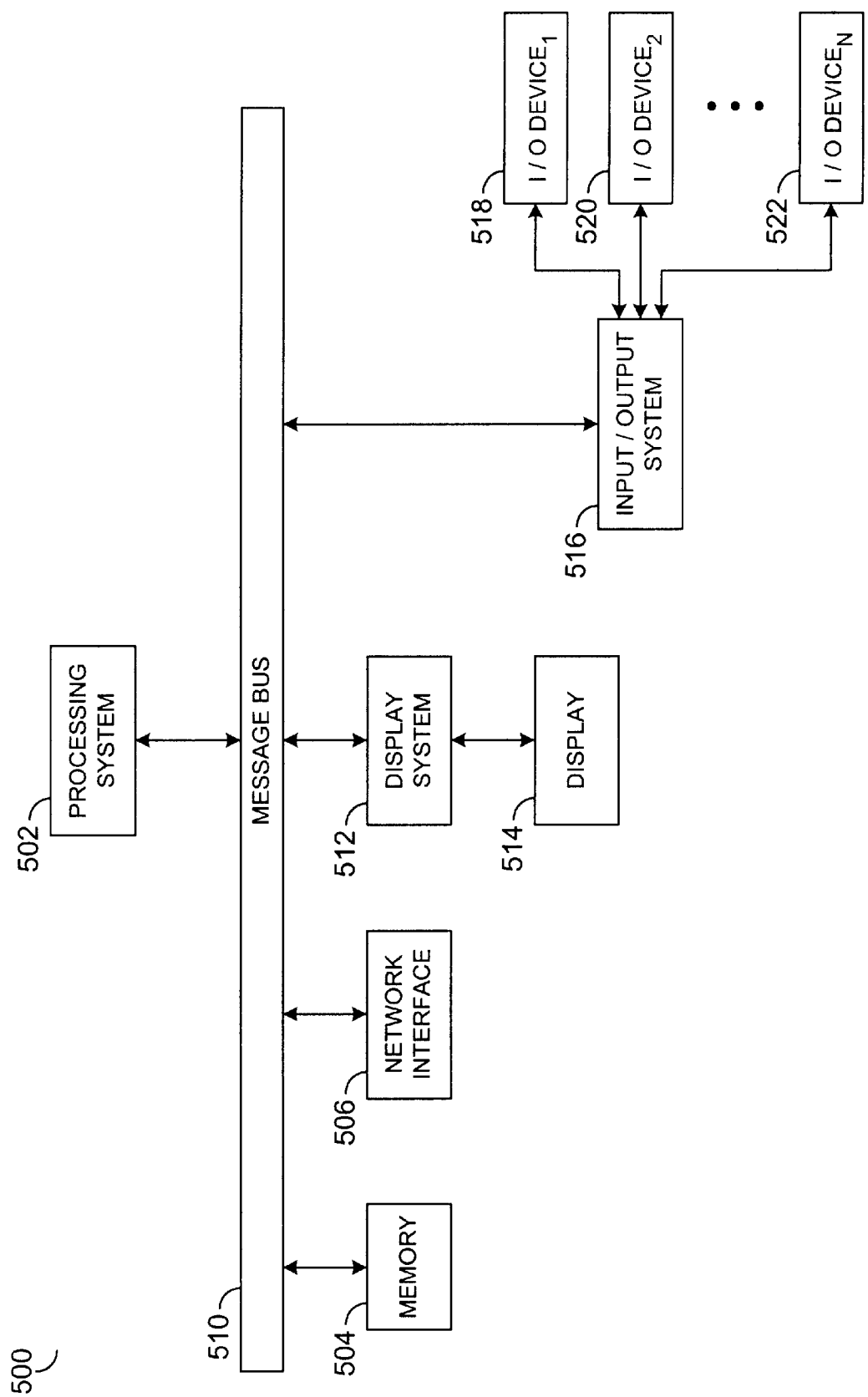
FIG. 5 is a block diagram of a computer system operable to embody at least one implementation of the present invention.

Referring now to FIG. 5, a hardware system in accordance with the present invention is shown. The hardware system shown in FIG. 5 is generally representative of the hardware architecture of a computer based system capable of implementing a software embodiment of the present invention. Computer system 500 may be configured to implement decoder 200, for example, syndrome calculator 202, Chien search module 204, and associated logic blocks 206, 208 & 210. Furthermore, computer system 500 may be specifically programmed by a machine readable program of instructions capable of causing the computer system 500 the steps of the method employed by decoder 200 as shown in FIG. 2.

The hardware system 500 is controlled by a central processing system 502. The central processing system 502 includes a central processing unit such as a microprocessor or microcontroller for executing programs, performing data manipulations and controlling the tasks of the hardware system 500. Communication with the central processor 502 is implemented through a system bus 510 for transferring information among the components of the hardware system 500. The bus 510 may include a data channel for facilitating information transfer between storage and other peripheral components of the hardware system. The bus 510 further provides the set of signals required for communication with the central processing system 502 including a data bus, address bus, and control bus. The bus 510 may comprise any state of the art bus architecture according to promulgated standards, for example industry standard architecture (ISA), extended industry standard architecture bus, standards promulgated by the Institute of Electrical and Electronics Engineers (IEEE) including IEEE 488 general-purpose interface bus (GPIB), IEEE 696/S-100, and so on. Other components of the hardware system 500 include main memory 504, and auxiliary memory 506. The hardware system 500 may further include an auxiliary processing system 508 as required. The main memory 504 provides storage of instructions and data for programs executing on the central processing system 502. The main memory 504 is typically semiconductor-based memory such as dynamic random access memory (DRAM) and/or static random access memory (SRAM). Other semi-conductor-based memory types include, for example, synchronous dynamic random access memory (SDRAM), Rambus dynamic random access memory (RDRAM), ferroelectric random access memory (FRAM), and so on. The auxiliary memory 506 provides storage of instructions and data that are loaded into the main memory 504 before execution. The auxiliary memory 506 may include semiconductor based memory such as read-only memory (ROM), programmable read-only memory (PROM), erasable programmable read-only memory (EPROM), electrically erasable read-only memory (EEPROM), or flash memory (block oriented memory similar to EEPROM). The auxiliary memory 506 may also include a variety of non-semiconductor-based memories, including but not limited to magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), etc. Other varieties of memory devices are contemplated as well. The hardware system 500 may optionally include an auxiliary processing system 508 which may be an auxiliary processor to manage input/output, an auxiliary processor to perform floating point mathematical operations, a digital signal processor (a special-purpose microprocessor having an architecture suitable for fast execution of signal processing algorithms), a back-end processor (a slave processor subordinate to the main processing system), an additional microprocessor or controller for dual or multiple processor systems, or a coprocessor. It will be recognized that such auxiliary processors may be discrete processors or may be built in to the main processor.

The hardware system 500 further includes a display system 512 for connecting to a display device 514, and an input/output (I/O) system 516 for connecting to one or more I/O devices 518, 520, and up to N number of I/O devices 522. The display system 512 may comprise a video display adapter having all of the components for driving the display device, including video memory, buffer, and graphics engine as desired. Video memory may be, for example, video random access memory (VRAM), synchronous graphics random access memory (SGRAM), windows random access memory (WRAM), and the like. The display device 514 may comprise a cathode ray-tube (CRT) type display such as a monitor or television, or may comprise an alternative type of display technology such as a projection-type display, liquid-crystal display (LCD), light-emitting diode (LED) display, gas or plasma display, electroluminescent display, vacuum fluorescent display, cathodoluminescent (field emission) display, plasma-addressed liquid crystal (PALC) display, high gain emissive display (HGED), and so forth. The input/output system 516 may comprise one or more controllers or adapters for providing interface functions between the one or more I/O devices 518–522. For example, the input/output system 516 may comprise a serial port, parallel port, universal serial bus (USB) port, IEEE 1394 serial bus port, infrared port, network adapter, printer adapter, radio-frequency (RF) communications adapter, universal asynchronous receiver-transmitter (UART) port, etc., for interfacing between corresponding I/O devices such as a keyboard, mouse, trackball, touchpad, joystick, trackstick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, etc. The input/output system 516 and I/O devices 518–522 may provide or receive analog or digital signals for communication between the hardware system 500 of the present invention and external devices, networks, or information sources. The input/output system 516 and I/O devices 518–522 preferably implement industry promulgated architecture standards, including Ethernet IEEE 802 standards (e.g., IEEE 802.3 for broadband and baseband networks, IEEE 802.3z for Gigabit Ethernet, IEEE 802.4 for token passing bus networks, IEEE 802.5 for token ring networks, IEEE 802.6 for metropolitan area networks, and so on), Fibre Channel, digital subscriber line (DSL), asymmetric digital subscriber line (ASDL), frame relay, asynchronous transfer mode (ATM), integrated digital services network (ISDN), personal communications services (PCS), transmission control protocol/Internet protocol (TCP/IP), serial line Internet protocol/point to point protocol (SLIP/PPP), and so on. It should be appreciated that modification or reconfiguration of the hardware system 500 of FIG. 5 by one having ordinary skill in the art would not depart from the scope or the spirit of the present invention.

Although the invention has been described with a certain degree of particularity, it should be recognized that elements thereof may be altered by persons skilled in the art without departing from the spirit and scope of the invention. Embodiments of the present invention may be implemented as sets of instructions resident in the main memory 504 of the one or more computer systems configured generally as described in FIG. 5. Until required by the computer system, the set of instructions may be stored in another computer readable medium or memory, for example in a hard disk drive, or in a removable memory such as an optical disk for utilization in a CD-ROM drive, a floppy disk for utilization in a floppy disk drive, a floptical disk for utilization in a floptical drive, or a personal computer memory card for utilization in a personal computer card slot. Further, the set of instructions may be stored in the memory of another computer and transmitted over a local area network or a wide area network, such as the Internet, when desired by the user. One skilled in the art would appreciate that the physical storage of the sets of instructions physically changes the medium upon which it is stored electrically, magnetically, chemically, physically, optically, or holographically so that the medium carries computer readable information.

It is believed that the decoder of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A method of correcting symbol errors in a codeword of an extended Reed-Solomon RS (128,122,7) code over a Galois field GF(128), comprising:

calculating syndromes for the codeword;

determining the number of symbol errors in the codeword wherein up to two symbol errors in the codeword can be corrected;

if the number of symbol errors is greater than zero, finding the coefficients of an error locator polynomial;

if the number of symbol errors is greater than zero, locating the positions of the errors in the codeword; and if the number of symbol errors is greater than zero, finding the values of the symbol errors.

2. The method as claimed in claim 1, wherein the number of syndromes calculated is four.

3. The method as claimed in claim 2, wherein locating the positions of the errors in the codeword comprises performing a Chien search.

4. The method as claimed in claim 2, wherein finding the values of the symbol errors comprises solving the equation $$\begin{bmatrix} X_1 & X_2 \\ X_1^2 & X_2^2 \end{bmatrix} \begin{bmatrix} Y_1 \\ Y_2 \end{bmatrix} = \begin{bmatrix} S_1 \\ S_2 \end{bmatrix}.$$

5. The decoder according to claim 2, wherein the means for locating the positions of the errors in the codeword comprises a Chien search module.

6. The decoder according to claim 2, wherein the means for finding the values of the symbol errors solves the equation $$\begin{bmatrix} X_1 & X_2 \\ X_1^2 & X_2^2 \end{bmatrix} \begin{bmatrix} Y_1 \\ Y_2 \end{bmatrix} = \begin{bmatrix} S_1 \\ S_2 \end{bmatrix}$$

to find the values of the symbol errors.

7. The method as claimed in claim 2, wherein the error locator polynomial has the form $$\sigma(x) = \sum_{i=0}^{e} \sigma_i x^i.$$

8. The method as claimed in claim 7, wherein determining the number of symbol errors in the codeword further comprises testing the rank of the equation $$\begin{bmatrix} S_1 & S_2 \\ S_2 & S_3 \end{bmatrix} \begin{bmatrix} \sigma_2 \\ \sigma_1 \end{bmatrix} = \begin{bmatrix} S_3 \\ S_4 \end{bmatrix}.$$

9. The method as claimed in claim 7, wherein finding the coefficients of the error locator polynomial by solving the equation $$\begin{bmatrix} S_1 & S_2 \\ S_2 & S_3 \end{bmatrix} \begin{bmatrix} \sigma_2 \\ \sigma_1 \end{bmatrix} = \begin{bmatrix} S_3 \\ S_4 \end{bmatrix}.$$

10. A machine readable medium carrying a program of instructions for causing a machine to execute a method for correcting symbol errors in a codeword of an extended Reed-Solomon RS (128,122,7) code over a Galois field GF(128), the method comprising:
calculating syndromes for the codeword;
determining the number of symbol errors in the codeword wherein up to two symbol errors in the codeword can be corrected;
if the number of symbol errors is greater than zero, finding the coefficients of an error locator polynomial;
if the number of symbol errors is greater than zero, locating the positions of the errors in the codeword; and
if the number of symbol errors is greater than zero, finding the values of the symbol errors.

11. The machine readable medium carrying a program of instructions as claimed in claim 10, wherein the number of syndromes calculated is four.

12. The machine readable program of instructions as claimed in claim 11, wherein locating the positions of the errors in the codeword comprises performing a Chien search.

13. The machine readable program of instructions as claimed in claim 11, wherein finding the values of the symbol errors comprises solving the equation $$\begin{bmatrix} X_1 & X_2 \\ X_1^2 & X_2^2 \end{bmatrix} \begin{bmatrix} Y_1 \\ Y_2 \end{bmatrix} = \begin{bmatrix} S_1 \\ S_2 \end{bmatrix}.$$

14. The machine readable program of instructions as claimed in claim 11, wherein the error locator polynomial has the form $$\sigma(x) = \sum_{i=0}^{e} \sigma_i x^i.$$

15. The machine readable program of instructions as claimed in claim 14, wherein determining the number of symbol errors in the codeword further comprises testing the rank of the equation $$\begin{bmatrix} S_1 & S_2 \\ S_2 & S_3 \end{bmatrix} \begin{bmatrix} \sigma_2 \\ \sigma_1 \end{bmatrix} = \begin{bmatrix} S_3 \\ S_4 \end{bmatrix}.$$

16. The machine readable program of instructions as claimed in claim 14, wherein finding the coefficients of the error locator polynomial by solving the equation $$\begin{bmatrix} S_1 & S_2 \\ S_2 & S_3 \end{bmatrix} \begin{bmatrix} \sigma_2 \\ \sigma_1 \end{bmatrix} = \begin{bmatrix} S_3 \\ S_4 \end{bmatrix}.$$

17. A decoder capable of correcting symbol errors in a codeword of an extended Reed-Solomon RS (128,122,7) code over a Galois field GF(128), comprising:
means for calculating syndromes for the codeword;
means for determining the number of symbol errors in the codeword wherein up to two symbol errors in the codeword can be corrected;
means for finding the coefficients of an error locator polynomial if the number of symbol errors is greater than zero;
means for locating the positions of the symbol errors in the codeword if the number of symbol errors is greater than zero; and
means for finding the values of the symbol errors if the number of symbol errors is greater than zero.

18. The decoder according to claim 17, wherein the number of syndromes calculated by the syndrome calculating means is four.

19. The decoder according to claim 18, wherein the error locator polynomial has the form 20. The decoder according to claim 19, wherein the means for determining the number of symbol errors in the codeword tests the rank of the equation $$\begin{bmatrix} S_1 & S_2 \\ S_2 & S_3 \end{bmatrix} \begin{bmatrix} \sigma_2 \\ \sigma_1 \end{bmatrix} = \begin{bmatrix} S_3 \\ S_4 \end{bmatrix}$$

to determine the number of symbol errors in the codeword.

21. The decoder according to claim 19, wherein the means for finding the coefficients of an error locator polynomial solves the equation $$\begin{bmatrix} S_1 & S_2 \\ S_2 & S_3 \end{bmatrix} \begin{bmatrix} \sigma_2 \\ \sigma_1 \end{bmatrix} = \begin{bmatrix} S_3 \\ S_4 \end{bmatrix}$$

to find the coefficients of the error locator polynomial.

\* \* \* \* \*